(12) United States Patent
Otterstedt et al.

(10) Patent No.: US 10,497,408 B2
(45) Date of Patent: Dec. 3, 2019

(54) MEMORY CIRCUIT INCLUDING OVERLAY MEMORY CELLS AND METHOD OF OPERATING THEREOF

(71) Applicant: Infineon Technologies AG, Neubiberg (DE)

(72) Inventors: Jan Otterstedt, Unterhaching (DE); Robin Boch, Holzkirchen (DE); Gerd Dirscherl, Munich (DE); Bernd Meyer, Munich (DE); Christian Peters, Vaterstetten (DE); Steffen Sonnekalb, Munich (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 15/831,439

(22) Filed: Dec. 5, 2017

(65) Prior Publication Data
US 2018/0158534 A1    Jun. 7, 2018

(30) Foreign Application Priority Data

Dec. 7, 2016 (DE) ........................ 10 2016 123 689

(51) Int. Cl.
*G11C 7/10* (2006.01)
*G06F 11/10* (2006.01)
(Continued)

(52) U.S. Cl.
CPC ........ *G11C 7/1006* (2013.01); *G06F 11/1048* (2013.01); *G06F 11/25* (2013.01); *G06F 12/0246* (2013.01); *G11C 16/08* (2013.01); *G11C 16/105* (2013.01); *G11C 16/26* (2013.01); *G11C 29/34* (2013.01); *H03M 13/13* (2013.01); *G11C 2029/2602* (2013.01)

(58) Field of Classification Search
CPC ....... G11C 29/34; G11C 7/1006; G11C 16/08; G11C 16/105; G11C 16/26; G11C 2029/2602; H03M 13/13; G06F 11/25; G06F 11/1048; G06F 12/0246
See application file for complete search history.

(56) References Cited

U.S. PATENT DOCUMENTS

6,768,685 B1    7/2004  Scheuerlein
9,899,095 B2 *  2/2018  Hosono .............. G11C 16/0408
(Continued)

*Primary Examiner* — David Lam
(74) *Attorney, Agent, or Firm* — Viering, Jentschura & Partner MBB (57) ABSTRACT

A memory circuit may include a plurality of electrically programmable memory cells arranged in an electrically programmable non-volatile memory cell array along a plurality of rows and a plurality of columns, a plurality of word lines, each word line coupled with a plurality of word portions of the plurality of memory cells, each word portion configured to store a data word, and at least one overlay word line coupled with a plurality of overlay portions, each overlay portion including overlay memory cells, each of the plurality of overlay portions including an overlay word. The memory circuit is configured to read, for each of the plurality of word lines, from each of the word portions simultaneously with an overlay portion of the plurality of overlay portions, with an output of the read operation being a result of a logic operation performed on the data word and the overlay word.

12 Claims, 7 Drawing Sheets

(51) Int. Cl.
   *G06F 11/25*   (2006.01)
   *G06F 12/02*   (2006.01)
   *G11C 16/08*   (2006.01)
   *G11C 16/10*   (2006.01)
   *G11C 16/26*   (2006.01)
   *G11C 29/34*   (2006.01)
   *H03M 13/13*   (2006.01)
   *G11C 29/26*   (2006.01)

(56) References Cited

U.S. PATENT DOCUMENTS

| | | | |
|---|---|---|---|
| 2009/0257278 A1* | 10/2009 | Hahn | G11C 8/10 |
| | | | 365/185.11 |
| 2011/0185259 A1 | 7/2011 | Seo et al. | |
| 2015/0036434 A1* | 2/2015 | Hara | G11C 16/26 |
| | | | 365/185.17 |
| 2015/0380089 A1* | 12/2015 | Aritome | G11C 16/0408 |
| | | | 365/185.11 |

\* cited by examiner

| addr | 7 | 6 | 5 | 4 | 3 | 2 | 1 | 0 |
| A | 111000 | 110001 | 101010 | 100011 | 011100 | 010101 | 001110 | 000111 |

$addr_w$  $not(addr_w)$        $addr_w$  $not(addr_w)$

MEMORY CIRCUIT INCLUDING OVERLAY MEMORY CELLS AND METHOD OF OPERATING THEREOF

CROSS-REFERENCE TO RELATED APPLICATION

This application claims priority to German Patent Application Serial No. 10 2016 123 689.6, which was filed Dec. 7, 2016, and is incorporated herein by reference in its entirety.

TECHNICAL FIELD

Various embodiments relate generally to a memory circuit and to a method of operating a memory circuit.

BACKGROUND

In a basic typical arrangement, memory cells may be arranged in a matrix fashion, wherein, in one direction, the memory cells may be connected to common word lines, and in an orthogonal direction they may be connected to common bit lines. More hierarchies may be based on this arrangement, but this may be irrelevant here.

Conventionally, an "erase" operation may affect all the memory cells connected to at least one word line, setting all of them to a value defining an unwritten state, e.g., to '1', a "write" operation may affect some memory cells connected to one word line, setting them to a value defining a written state, e.g., to '0', wherein the specific memory cells to be written may be selected through the bit lines, and a "read" operation may read out some memory cells connected to one word line, resulting in data consisting of '1's and '0's, wherein the specific memory cells to be read may be selected through the bit lines.

For all of these operations, an address may define which word line and (except for the erase operation) which bit lines are to be operated on.

For an operation of a highly secure memory, it may be essential to be able to reliably verify that the memory operations like erase, write, and read are or have been really performed on the intended memory cells, even in a case of an attacker having physical access to the chip.

This may be difficult to achieve, if one has to assume that the attacker is not only able to manipulate the erase, write, and/or read operations, but also to manipulate the verify operation itself.

In part, this aim may currently be achieved by using an address dependent data encryption. However, by this, not all relevant cases may be covered.

SUMMARY

In various embodiments, a memory circuit is provided. The memory circuit may include a plurality of electrically programmable memory cells arranged in an electrically programmable non-volatile memory cell array along a plurality of rows and a plurality of columns, a plurality of word lines, each word line coupled with a plurality of word portions of the plurality of memory cells, wherein each word portion is configured to store a data word, and at least one overlay word line coupled with a plurality of overlay portions, each overlay portion comprising a plurality of overlay memory cells, wherein each of the plurality of overlay portions comprises an overlay word, wherein the memory circuit is configured to read, for each of the plurality of word lines, from each of the word portions simultaneously with an overlay portion of the plurality of overlay portions, thereby providing, as an output of the read operation, a result of a logic operation performed on the data word and the overlay word.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Herein, for various elements (e.g., memory cells, word lines, bit lines, marking bit lines, etc.) that may occur in pluralities, a common basic reference number may be used, which may, e.g. in the figures and description thereof, be followed by a number for identifying individual elements of the plurality of elements. Even in a case of only the individual identification being used, the identified element is to be understood as being a representative of the basic element.

In various embodiments, a design and operation of a highly secure non-volatile memory (NVM) may be provided. For example, a memory circuit and a method of operating a memory circuit may be provided.

In various embodiments, a memory circuit may be provided with an additional capability to perform, e.g. simultaneously, a read operation from two word lines in the memory array (this process may be referred to as "overlaid reading"), thereby addressing, for example, one data word in each word line. The, e.g. simultaneous, reading may yield a result of an implicitly performed logic operation of the two addressed data words.

In various embodiments, multiple write operations may be performed on the same portion of a word line in the memory array (this process may be referred to as "overlaid writing"), wherein a data word written during a first write operation may be referred to as an existing word or a base word, and a data word written during a second or further write operation may be referred to as new data word or simply as data word. The writing may result in storing a result of an implicitly performed logic operation of the existing data word and the new data word.

In various embodiments, for the overlaid writing, specially constrained random values that may hold special properties and that may be extended by overwriting, so that they may again hold some different special properties, may be used.

Each of the features of the above described embodiments (overlaid reading, overlaid writing, and overlaid writing using the constrained random values) on its own may have its merits and may already solve a relevant part of the problem (of being able to reliably verify that memory operations like erase, write, and read are or have been really performed on the intended memory cells), but combined, e.g. combining all three features or combining just two of the three, they may be extremely powerful to improve security.

In various embodiments, the overlaid reading may be used to verify that some data is read from the intended bit lines.

In various embodiments, a correct execution of a read operation may be verified by not only reading out the addressed word line in a normal way (which may yield a requested data word), but additionally reading out the same word, but now overlaid with a corresponding overlay word of an overlay word line. The overlay word may be configured to allow an identification of the word line, for example by including an address code. The overlaid reading may be performed by reading the data word and the overlay word simultaneously, thereby inherently performing a logic operation on pairwise bits of the data word and of the overlay word, respectively. The logic operation may depend on a layout, e.g. type, of the memory circuit and may for example be one of an AND, OR, NAND, NOR, XOR or XNOR operation. Using the known overlay word, the standalone-read data word and the overlay-read data word, it may be checked if applying the logic operation on the pair of the data word and the overlay word results in the overlay-read word. If this condition is not fulfilled, a different (or no) set of bit lines (which may correspond to a word address within the word line) than was intended may have been targeted by the read process.

In various embodiments, it may be possible to write the words on the overlay word line $WL_{o1}$ like any normal memory cell. Thus, a word position (which may correspond to a word address) may intentionally be marked as invalid by writing the corresponding position on $WL_{o1}$ to a value that is invalid, e.g. to all-'0', so that the above described check (if applying the logic operation on the pair of the data word and the overlay word results in the overlay-read word) may fail with very high probability, until the word line $WL_{o1}$ is erased and re-initialized again.

In various embodiments, more than one overlay word line $WL_{o1}$, e.g. with different codes, may be used. Thereby, more combinations of the overlay word lines with the selected word line during overlaid read may be provided, such that an even higher data security level may be achieved.

In various embodiments, two complementarily coded word lines, for example with values of one of the two complementary word lines being inverse values of values of the other word line, may be used. In such a case, a perfect invalidation may be achieved by writing the respective position on both complementarily coded word lines to all-'0'.

In various embodiments, a method of securely overwriting data may be provided. The method may be referred to as overlaid writing. In various embodiments, after the writing, it may still be checked that the correct data was overwritten (and not some other data or no data at all). In various embodiments, an already existing data word (in other words, a data word that may already be stored in a memory) may be overwritten with at least one predefined pattern (also referred to as a check word or overlay word). The write operation may implicitly perform a logic operation (e.g. bitwise) on the data word and the overlay word, yielding an overlaid word. The logic operation may depend on a layout, e.g. type, of the memory circuit and may for example be one of an AND and an OR operation.

In various embodiments, the overlaid writing may be used to verify that really the intended data were overwritten. In various embodiments, performing a read process after the overwriting may yield an overlaid word (of the data word overlaid with the overlay word). In combination with the, e.g. known, overlay word and the, e.g. known, data word, it may be checked if applying the logic operation on the pair of the data word and the overlay word results in the overlaid word. If this condition is not fulfilled, a different (or no) portion of the memory than was intended may have been targeted by the write process, which may mean that the data word may still be available instead of having been overwritten.

In various embodiments, the overlay word may include an equal number of '1's and '0's, such that the logic AND may affect half of the bits in a word.

In various embodiments, the data word and/or the overlay word may be formed as constrained random values, wherein the random values may for example be constrained with respect to a number of written bits, for example to contain a defined number of '0'. For the overlay word, the written bits may be configured to correspond to unwritten bits of the data word. In this way, in various embodiments, a number of written bits of the overlaid word may correspond to a sum of the written bits of the data word and of the written bits of the overlay word. This may allow to verify if a number of written bits of a read word, e.g. of the overlaid word resulting from a read operation, corresponds to the sum of the written bits of the data word and of the overlay word, even if both words, except for this constraint, may be random.

Figure 1A:
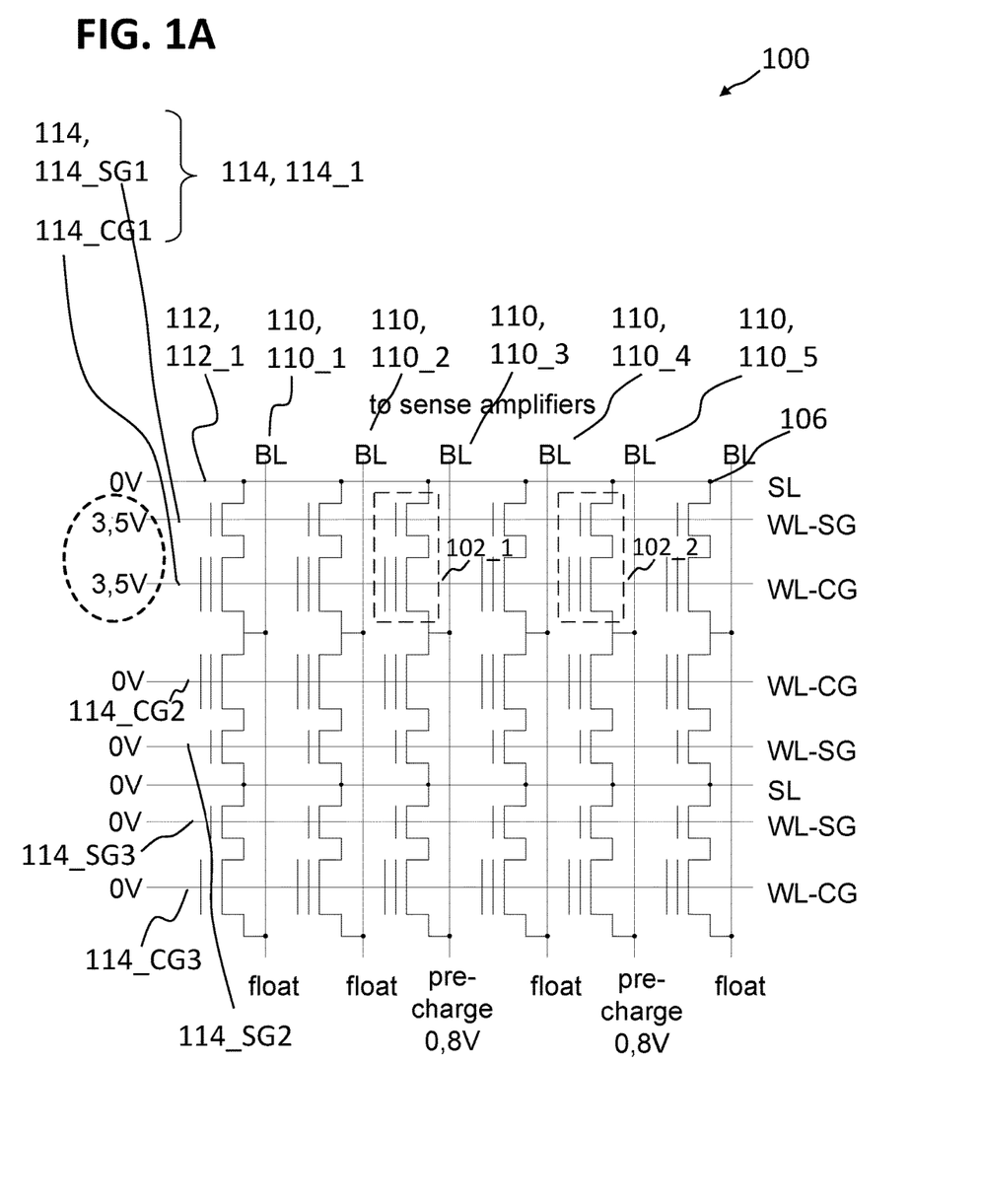
FIGS. 1A and 1B show schematic drawings of a memory circuit in accordance with various embodiments.
Figure 1B:
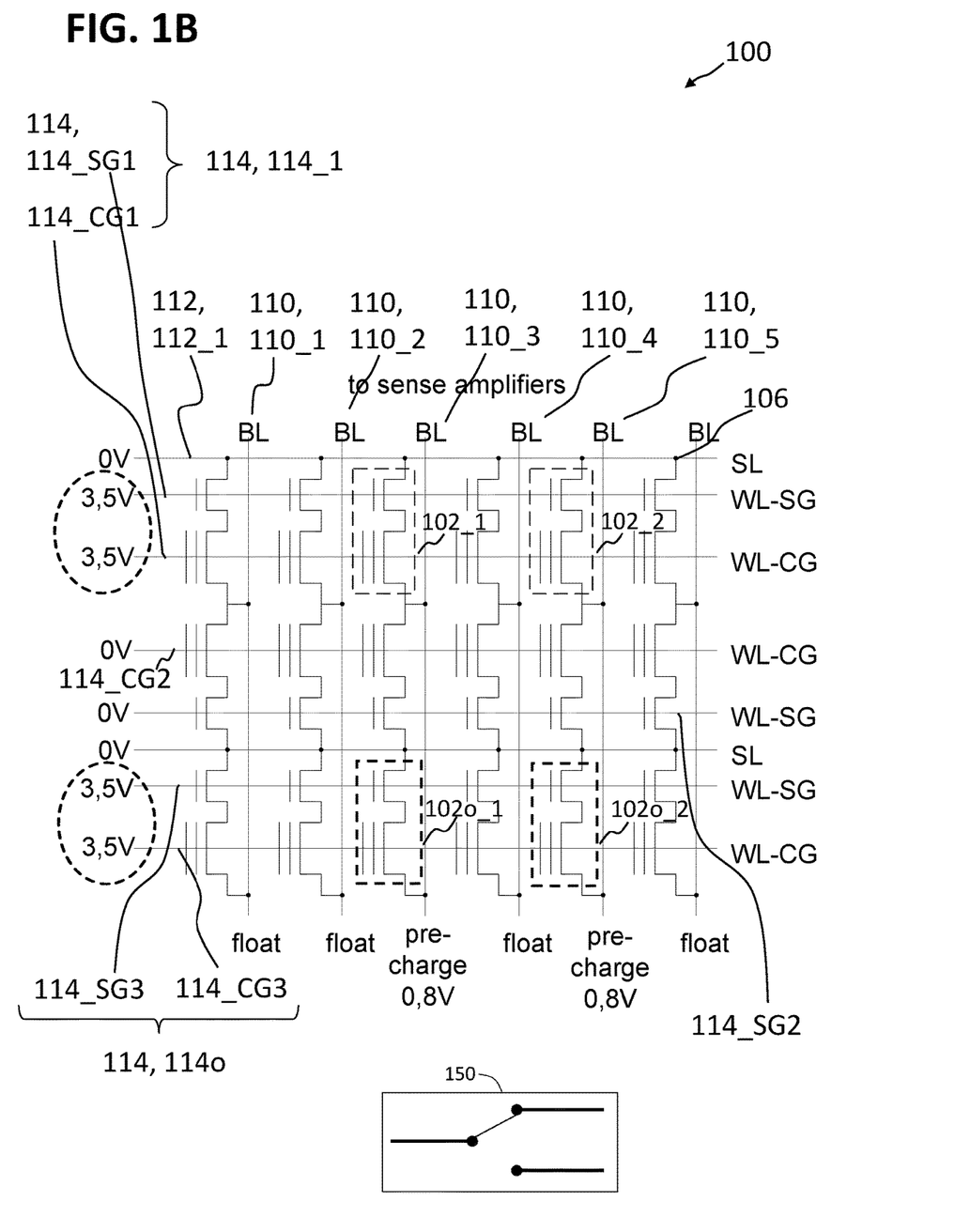
Figure 2:
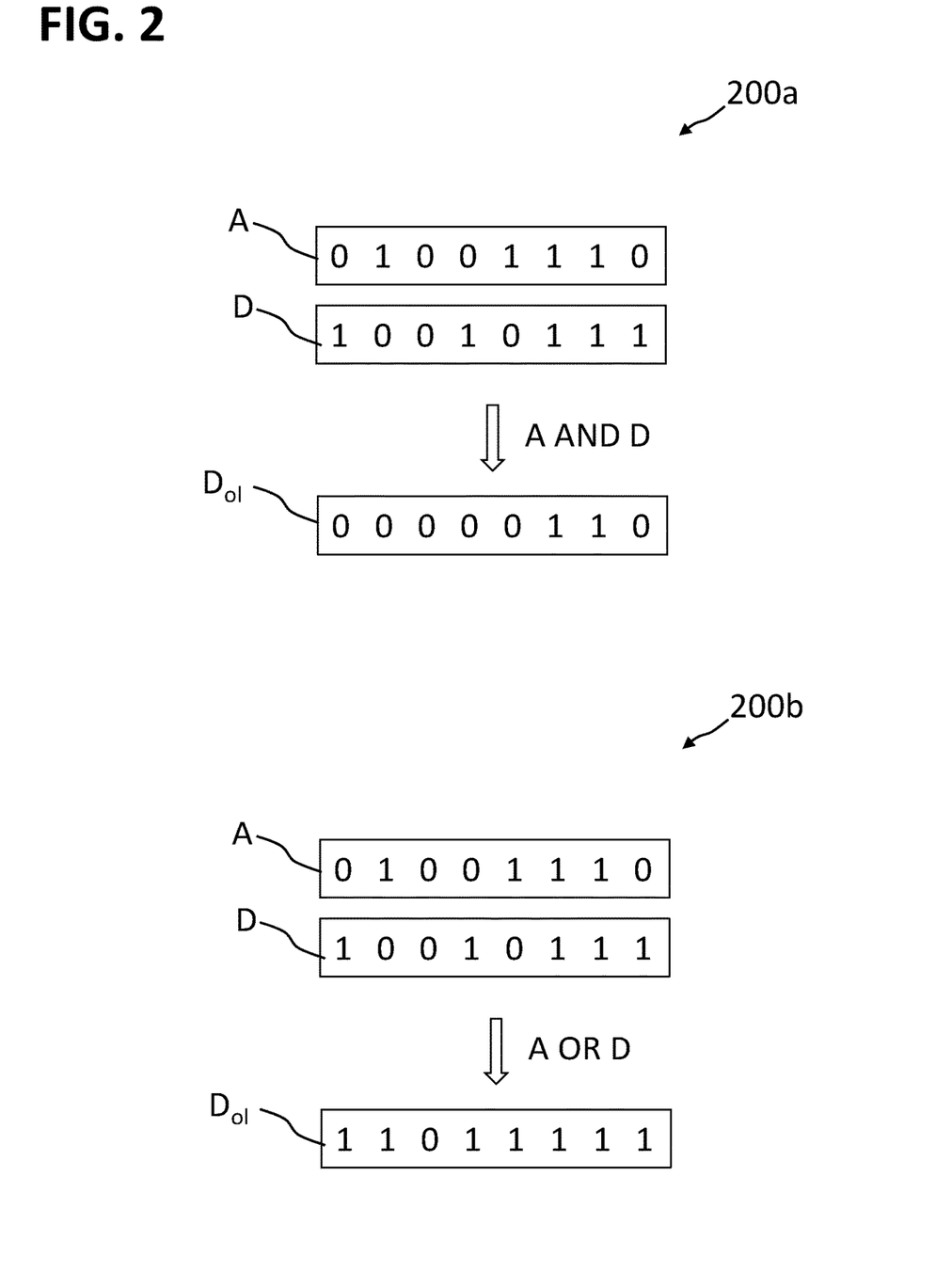
FIG. 2 shows an illustration of a method of operating a memory circuit in accordance with various embodiments.
Figure 3:
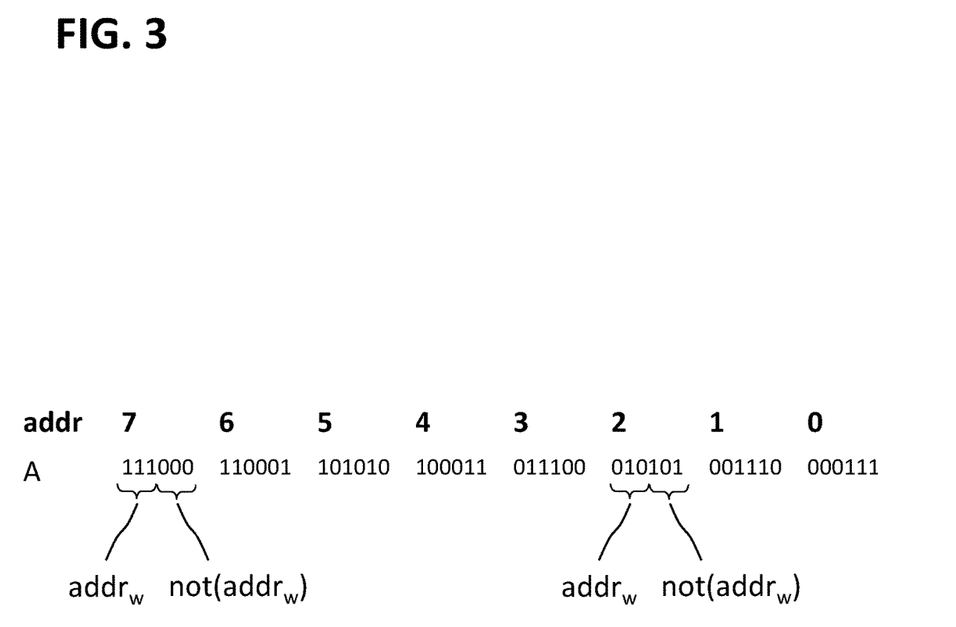
FIG. 3 shows exemplary overlay word line data for use in a memory circuit and in a method of operating the memory circuit in accordance with various embodiments.

FIG. 1A and FIG. 1B show schematic drawings of a memory circuit 100 in accordance with various embodiments, FIG. 2 shows an illustration of a method of operating a memory circuit in accordance with various embodiments, and FIG. 3 shows exemplary overlay word line data for use in a memory circuit 100 and in a method of operating the memory circuit in accordance with various embodiments.

The memory circuit 100 may, in various embodiments, include a plurality of electrically programmable memory cells 102 arranged in an electrically programmable non-volatile memory cell array along a plurality of rows and a plurality of columns, wherein the memory cell array may have any suitable number of memory cells, rows and columns, respectively. The memory cells 102 may be formed as known in the art. For example, each memory cell 102 may include at least one transistor having a source, a drain, and a gate. The exemplary memory circuit 100 shown in FIG. 1A, which may be based on an HS3P memory array, may for example include two transistors per memory cell. Memory circuits of other exemplary embodiments, e.g. a memory array of an 1T-UCP memory array (not shown) may for example include one transistor per memory cell.

The memory circuit 100 may, in various embodiments, further include a plurality of word lines 114. Each of the word lines 114 may be coupled, for example as known in the art, with a plurality of word portions of the plurality of memory cells 102, wherein each word portion may be configured to store a data word. For example, for the coupling, each word line 114 may be electrically connected to a gate terminal of each of the respective one or more memory cells 102 that the word line 114 may be coupled with.

The memory circuit 100 may, in various embodiments, further include at least one overlay word line 114o coupled with a plurality of overlay portions, each overlay portion comprising a plurality of overlay memory cells 102o, wherein each of the plurality of overlay portions may include an overlay word.

In the embodiment shown in FIG. 1A and FIG. 1B, an HS3P memory circuit is visualized as a representative example. In the HS3P memory circuit configuration, each word line 114 of the plurality of word lines 114 may include a select gate portion 114_SG, WL-SG and a control gate portion 114_CG, WL-CG. However, the various embodiments are to be understood as not being limited to this configuration. For example, each word line 114 of the plurality of word lines 114 may include only a single, e.g. control gate, portion, or may include more than two portions.

The memory cells 102 may, in various embodiments, be configured to assume at least two different states. The memory cells 102 may for example be set to and/or switched between two, three, four, or more different states (also referred to as levels). In the following examples, two-level memory cells will be described, and the two levels will be referred to as 1 and 0, respectively, but the described principles are to be understood as being applicable also to three-, four-, or more level memory cells.

In various embodiments, the memory circuit 100 may be configured to perform a normal read process, which is visualized in FIG. 1A.

In various embodiments, the normal read process shown in FIG. 1A may be performed as known in the art. For example, for reading from two memory cells 102_1, 102_2 located on a word line 114_1 and on two different bit lines 110_3, 110_5, the (single) word line 114 of the plurality of word lines 114 and the two bit lines 110_3, 110_5 may be activated, for example by applying a voltage. In FIG. 1A, this is indicated by setting a voltage of both portions 114_SG1, 114_CG1 of the word line 114_1 to 3.5V, and by setting a precharge of the bit lines 110_3, 110_5 to 0.8V (the specific voltages may be exemplary). Expressing a value of a memory cell 102 as D[102], the output of, e.g. the read data resulting from the shown read process, may be written as {D[102_1]; D[102_2]}.

In various embodiments, the memory circuit 100 may be configured to read, for each of the plurality of word lines 114, from each of the word portions simultaneously with an overlay portion of the plurality of overlay portions, thereby providing, as an output of the read operation, a result of a logic operation, e.g. a logic AND, OR, NAND, NOR, XOR or XNOR, which may be performed on the data word and the overlay word. This may be referred to as an overlaid read process or overlaid read. It is visualized in FIG. 1B.

In various embodiments, in the overlaid read process, for reading, e.g. reading a bit value, from two memory cells 102_1, 102_2 located on a word line 114_1 and overlaying them during the read with signals, e.g. bit values, from overlay memory cells 102o (in FIG. 1B, the individual overlay cells are marked as 102o_1 and 102o_2, respectively, wherein a signal from the memory cell 102_1 is to be overlaid by the signal from the overlay cell 102o_1, and a signal from the memory cell 102_2 is to be overlaid by the signal from the overlay cell 102o_2), in addition to activating the word line 114_1 and the bit lines 110_3 110_5 as described above, the word line 114_3 (including 114_SG3 and 114_CG3) may be activated, e.g. by setting its voltage, e.g. to an exemplary value of 3,5V.

Thereby, an output signal, e.g. an output voltage, from the read process, e.g. a signal provided to a sense amplifier (not shown), e.g. to a plurality of sense amplifiers, may be an overlaid signal of the two memory cells located on the same bit line 110. In FIG. 1B, the bit line 110_3 may provide an overlaid signal of the memory cell 102_1 and the overlay memory cell 102o_1, and the bit line 110_5 may provide an overlaid signal of the memory cell 102_2 and the overlay memory cell 102o_2, which may be converted to an output bit value, e.g. by the sense amplifier.

In various embodiments, the output bit value may be a result of a logic operation performed on the bit value of the memory cell 102 and of the overlay memory cell 102o. A nature of the logic operation, e.g. if an OR operation or an AND operation is, e.g. inherently, performed, may depend on a configuration of the memory circuit. In the exemplary HS3P memory circuit, an OR operation may be performed (both selected (overlay) memory cells 102, 102o may be able to pull down the bit line, with one conducting cell being sufficient for resulting in an "erased" (in the HS3P memory circuit, an erased bit may be assigned a value of "1", and a written bit may be assigned a value of "0") signal, thus the configuration of the memory array of FIG. 1A may be set up to perform an OR operation).

In various embodiments (not shown), the memory circuit may be configured to perform an AND operation, for example in memory circuits having a NAND structure, e.g. as typically used in stand-alone memory devices like memory sticks and solid state devices (SSDs).

In various embodiments, reassigning erased/written to the opposite logic values '0'/'1' (e.g., assigning "0" to erased and "1" to written) may also lead to a different logic operation.

For example, the overlaid signal provided to/by the bit line 110_3 may correspond to the values of memory cell 102_1 and overlay memory cell 102o_1 being combined by an OR operation, and the overlaid signal provided to/by the bit line 110_5 may correspond to the values of memory cell 102_2 and overlay memory cell 102o_2 being combined by an OR operation. The read values, e.g. the read data, e.g. read bits, of this example may be expressed as {D[102_1] OR D[102o_1]; D[102_2] OR D[102o_2]}.

In various embodiments, a correct execution of a read operation may be verified by not only reading out the addressed word line 114 (114_1 in FIG. 1A and FIG. 1B) in a normal way, e.g. as shown in FIG. 1A, which may yield a requested data word D, which may include a plurality of bits, but by additionally reading out the same word overlaid with at least one corresponding overlay word A of at least one overlay word line 114, 114o (in FIG. 1B, the word line 114_3 may be used as the overlay word line 114o), wherein the overlay word A may include a plurality of bits, for example a number of bits that may be the same as the number of bits of the data word, and wherein the overlaid read may yield, as a read result, the overlaid word $D_{o1}$.

In various embodiments, the data, i.e. the overlaid word $D_{o1}$, yielded by this read operation may be defined by a logic operation performed, e.g. bitwise, on the data bits (bits of the data word D and of the corresponding overlay word A) on the word lines 114_1, 114o that are connected to the same bit lines (110_3 for the data word including the bit in the memory cell 102_1 and the corresponding overlay word including the bit in the overlay memory cell 102o_1; 110_5 for the data word including the bit in the memory cell 102_2 and the corresponding overlay word including the bit in the overlay memory cell 102o_2), and thus to the same read circuitry, typically a sense amplifier.

In various embodiments, the logic operation may be an OR operation or an AND operation, depending on a configuration of the memory array 100.

The logic operation may in various embodiments be performed implicitly through the parallel activation of the memory cells (i.e., the memory cell 102 and the overlay memory cell 102o) and not by a dedicated logic gate.

FIG. 2 shows, in panel 200a, an application of the logic operation, in this case the AND operation, to the data word D and the overlay word A, resulting in the overlaid word $D_{o1}$. and in panel 200b, an application of the logic operation, in this case the OR operation, to the data word D and the overlay word A, resulting in the overlaid word $D_{o1}$.

In various embodiments, the memory circuit 100 may include a switch (generically represented as switch 150 in FIG. 1B). The switch may be configured to switch between the normal read mode and the overlaid read mode described above.

In various embodiments, a correct execution of a read operation may be verified by performing both, the normal read and the overlaid read (using the overlay word A) of the data word, e.g. as described above, yielding the data word D and the overlaid data word $D_{o1}$. Using the known overlay word A, the read data word D and the overlaid data word $D_{o1}$, it may be checked if applying the logic operation on the pair of the data word D and the overlay word A results in the overlaid word $D_{o1}$. In other words, it may be checked if D OR A=$D_{o1}$ is true (for other memory circuit configurations, the appropriate logic operation, and thus the check, may be different, e.g. it may be checked if D AND A=$D_{o1}$). If this condition is not fulfilled, a different (or no) set of bit lines 110 (which may correspond to a word address within the word line 114) than was intended may have been targeted by the read process.

In various embodiments, the overlay word A may be configured to allow an identification of the bit line(s) 110 and/or of the word line 114 addressing the overlay word A.

In various embodiments, a verification if the intended word portion was read may be made possible using the overlaid read of the associated overlay portion.

In various embodiments, an address code may be included in the overlay word(s) A, e.g. be stored in the overlay portion(s). For example, the address code stored in the overlay portion(s) may indicate a position of the respective overlay portion within the word line 114, and/or the address code stored in the overlay portion(s) may indicate the word line 114 of the plurality of word lines 114, and/or the address code stored in the overlay portion(s) may indicate the overlay word line 114o of the plurality of overlay word lines 114o.

In various embodiments, the at least one overlay word line 114o may include one overlay word line 114o that may be associated with a plurality of word lines 114. Such an overlay word line 114o may also be referred to as common overlay word line 114o. In such an embodiment, if a read operation of a data word D stored in one of the plurality of word lines 114 is to be verified, the data word D may be read normally, and may be read overlaid with the overlay word A, resulting in the overlaid data word $D_{o1}$, such that the verification may be performed as described above. The overlay word A may in various embodiments (for an example, see FIG. 3) be configured to allow a verification of whether D (and A) was/were read from a correct word portion (within the word line 114). For example, the plurality of overlay words A stored in the plurality of word portions of the word line 114 may form a code. The code may for example be configured to indicate an address of the word portion within the word line 114. For allowing such a check, the same overlay word line 114o may be used for multiple word lines 114, e.g. for the plurality of word lines 114 or for a subset of the plurality of word lines 114.

In various embodiments, in a case of one overlay word line 114o being provided for the plurality of word lines 114, whenever the memory circuit 100 is configured to provide an overlaid read of one of the plurality of word lines 114, the one overlay word line 114o may be activated simultaneously with the word line 114.

In various embodiments, the at least one overlay word line 114o may include a plurality of overlay word lines 114o that may be associated with a plurality of word lines 114. In such an embodiment, if a read operation of a data word D stored in one of the plurality of word lines 114 is to be verified, the data word D may be read normally, and may be read overlaid with the overlay word A, resulting in the overlaid data word $D_{o1}$, such that the verification may be performed as described above. The overlay word A may in various embodiments (for an example, see FIG. 3) be configured to allow a verification of whether D (and A) was/were read from a correct, e.g. the addressed, word portion (within the word line 114), and possibly also to allow a verification of whether D was read from a correct word line 114. In such a case, each of the word lines 114 may have at least one associated overlay word line 114o that may be associated only with the word line 114 that it is configured to verify.

In various embodiments, in a case of the plurality of overlay word lines 114o being provided for the plurality of word lines 114, whenever the memory circuit 100 is configured to provide an overlaid read of one of the plurality of word lines 114, at least its one associated overlay word line 114o, which may not be associated to any other of the plurality of word lines 114, may be activated simultaneously with the word line 114.

In various embodiments, further overlay word lines 114o of the plurality of overlay word lines 114o may be activated simultaneously with the word line 114. For example, for each of the word lines 114, its one associated overlay word line 114o, which may not be associated to any other of the plurality of word lines 114 (which may for example be configured to verify the correct word line 114), may be activated simultaneously with the word line 114, and additionally, a common overlay word line of the plurality of overlay word lines 114o may be activated, wherein the common overlay word line may be configured, e.g. as described above, to verify the correct word position within the word line 114.

In various embodiments, using more than one overlay word line 114o more combinations of selected overlay word lines 114*o* during overlaid read may be possible, such that an even higher data security level may be achieved. Using two complementarily coded overlay word lines 114*o*_1 and 114*o*_2 (i.e. with bit values for the overlay word line 114_*o*1=inv (bit values for the overlay word line 114_*o*2) may be advantageous.

In various embodiments, other codes, which may not include the word portion and/or word line address, may be used as the code of the plurality of overlay words A.

In various embodiments, an error correction code may be used in the overlay words A and/or the data words D.

In various embodiments, since words on the overlay word line 114*o* may be written like any normal memory cell 102, a word portion (and the respective data word D stored therein) may, e.g. intentionally, be invalidated, e.g. by setting at least one of the bits of the associated overlay word A to an invalidating value (e.g. to all-'0'), in other words, to a value that may, upon verification by checking if D OR A=$D_{o1}$ is true or, respectively, if D AND A=$D_{o1}$ is true, may, with a very high probability, result in "false", in other words may fail. Thereby, the data word D may be invalidated without a necessity to erase the data word D, e.g. by performing an erase operation on the respective word portion. A write operation for setting, e.g. changing, one or more of the data bits of the data word D to a "wrong" value may be faster than the erase operation.

In various embodiments, e.g. in a case of using the two complemetarily coded overlay word lines 114*o*_1, 114*o*_2 as described above, a perfect invalidation may for example include or consist of writing the respective position on both overlay word lines 114*o*_1, 114*o*_2 to all-'0'.

In various embodiments, overlaid reading may be used to verify that some data are read from intended bit lines, e.g. from word line portions associated with the intended bit lines 110.

FIG. 3 shows exemplary overlay word line data, e.g. overlay words A, that may be used in various embodiments for the verifying that some data are read from intended bit lines, e.g. from word line portions associated with the intended bit lines 110.

In various embodiments, one overlay word line may be (at least partially) filled with data words A that may uniquely code the word address.

In the examplary embodiment of FIG. 3, the overlay word line may include a plurality (here: eight) word line portions having addresses 0 to 7. In each of the word line portions, one of a plurality of overlay words A may be stored. Each of the overlay words A may include at least an address part $addr_w$, which may code for the respective address of the word line portion, in other words, $add_w$ may denote the part of an address that may select the word within a word line. For example, in the overlay words A of the example of FIG. 3 having six bits, the address part of the overlay words may have three bits. The address part $addr_w$ of the word line portion having the address 0 may include the bits 000, the word line portion having the address 1 may include the bits 001, the word line portion having the address 2 may include the bits 010, etc.

Thus, in a case of a positive verification of comparing a result of the logical operation performed on the data word D and the corresponding overlay word A with a result of the overlaid reading of D and A may at the same time confirm the word portion address from which the data word (and the overlay word) was/were read.

In various embodiments, the overlay word A may further include a not ($addr_w$)-portion.

In various embodiments, preferably, e.g. for security reasons, the code may include overlay words A with an equal number of '1's and '0's, such that the logic OR may be able to affect half of the bits in a word, while the codes may otherwise be as different as possible.

In other various embodiments, one or more codes may be embedded in bitstrings for increasing a minimum distance of word marker codes. For example a (14, 4, 6) non-linear code (wherein all codewords may have a Hamming weight of 7) may be constructed by embedding a (7, 4, 3) linear code. In a case of the (7, 4, 3) code being given by rows {0x0b, 0x15, 0x26, 0x47} of a generator matrix and [m3, ..., m0] denoting message bits to be encoded, the resulting code word may consist of concatenations of bitstrings "01" and "10", wherein "01" may encode a '0' bit and "10" may encode a '1' bit of the 7 bit code word resulting from the (7, 4, 3) linear code. Therefore, the first code words are 0x1555, 0x159A, 0x1666, 0x16A9, 0x1969, 0x19A6, . . . .

In various embodiments, a protection of data by overlaid reading may rely on a high probability that the read $D_{o1}$=D OR A is different from D and A, because otherwise the check may be passed even though the data was read from a wrong place.

As a result, it may be desirable to have an, at least essentially, equal number of '1's and '0's in the overlay word A, but similarly also in the data word D. For the overlay word A, this may be easily achieved, since it may be made a property of the chosen coding.

In various embodiments, for the data word D, in a case of encrypted data being used, this property may be automatically achieved with a high probability. For plain data, a suitable coding may be used, if the stored data is not "random" already.

As an illustrative example, the following may be considered:

If A=all-1→$D_{o1}$=A, and if A=all-0→$D_{o1}$=D. In these cases, D, respectively D and $D_{o1}$, may have come from a wrong address. A similar situation may apply for D=all-1 and for D=all-0.

In various embodiments, the bits of A on the overlay word line 114*o* (having a coding that may be different for every word) may be realized using, at least for a portion of the bits, marker bits, wherein the marker bits may be formed by setting the corresponding memory cells to a permanent data value.

In various embodiments, this may allow, through overlaid reading, to authenticate the physical position of read data on a bitline, without the danger of accidentally losing (e.g. erasing) essential data on the overlay word line 114*o*.

Figure 4:
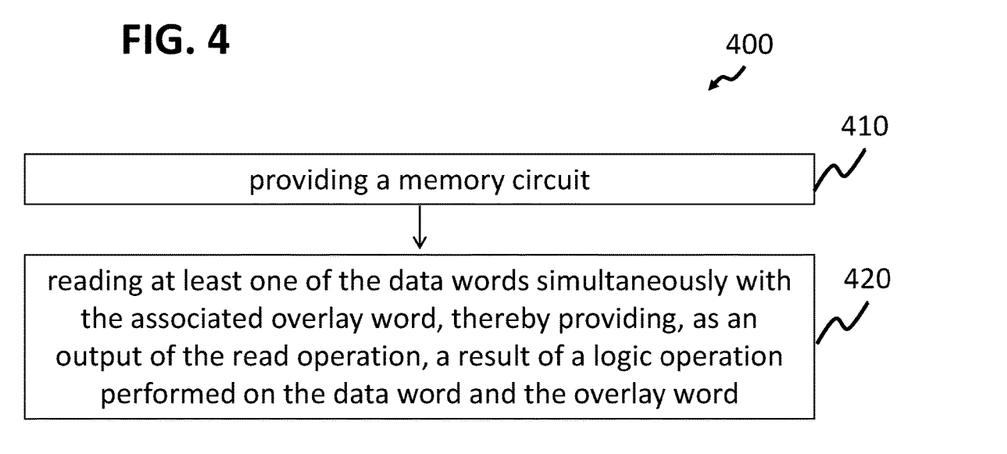
FIG. 4 shows a flow diagram of a method of operating a memory circuit in accordance with various embodiments.

In various embodiments, the overlaid reading described above may be combined with a so-called interleaved reading, which may include, e.g. simultaneously, reading from a plurality of positions within a given word line. For applying the interleaved reading, one or more of the plurality of word lines and/or of the plurality of overlay word lines may be associated with one or more marking memory cells of a plurality of electrically programmable non-volatile marking memory cells. One or more of the marking memory cells may be in a known memory state, and the plurality of marking memory cells may form a code configured to identify the associated word line of the respective one or more marking memory cells in the known memory state. The memory circuit may be configured to read, for each of the word lines, at least one memory cell, e.g. associated with the word line or the overlay word line, simultaneously with at least one marking memory cell of the one or more marking memory cell. The interleaved reading may include reading at least one memory cell of the one or more memory cells coupled to the word line (and/or to the overlay word line) simultaneously with at least one marking memory cell of the one or more marking memory cells associated with the word line (and/or the overlay word line, respectively). By reading data from the word line (and/or the overlay word line, respectively) simultaneously with the marking memory cells coding an identification of the word line, it may be verified from which word line the data were read. At least some of the marking memory cells may, in various embodiments, be in a non-changeable memory state, which may for example be achieved by setting (e.g. removing or not forming) a physical connection from an associated marking source line and/or from an associated marking bit line to the one or more marking memory cells. FIG. 4 shows a flow diagram 400 of a method of operating a memory circuit in accordance with various embodiments.

In various embodiments, the memory circuit may be provided (in 410). The memory circuit may include a plurality of electrically programmable memory cells arranged in an electrically programmable non-volatile memory cell array along a plurality of rows and a plurality of columns, a plurality of word lines, each word line coupled with a plurality of word portions of the plurality of memory cells, wherein each word portion is configured to store a data word, and at least one overlay word line coupled with a plurality of overlay portions, each overlay portion comprising a plurality of overlay memory cells, wherein each of the plurality of overlay portions comprises an overlay word, wherein the memory circuit is configured to read, for each of the plurality of word lines, from each of the word portions simultaneously with an overlay portion of the plurality of overlay portions, thereby providing, as an output of the read operation, a result of a logic operation performed on the data word and the overlay word.

In various embodiments, the method may include reading at least one of the data words simultaneously with the associated overlay word, thereby providing, as an output of the read operation, a result of a logic operation performed on the data word and the overlay word (in 420).

Figure 5:
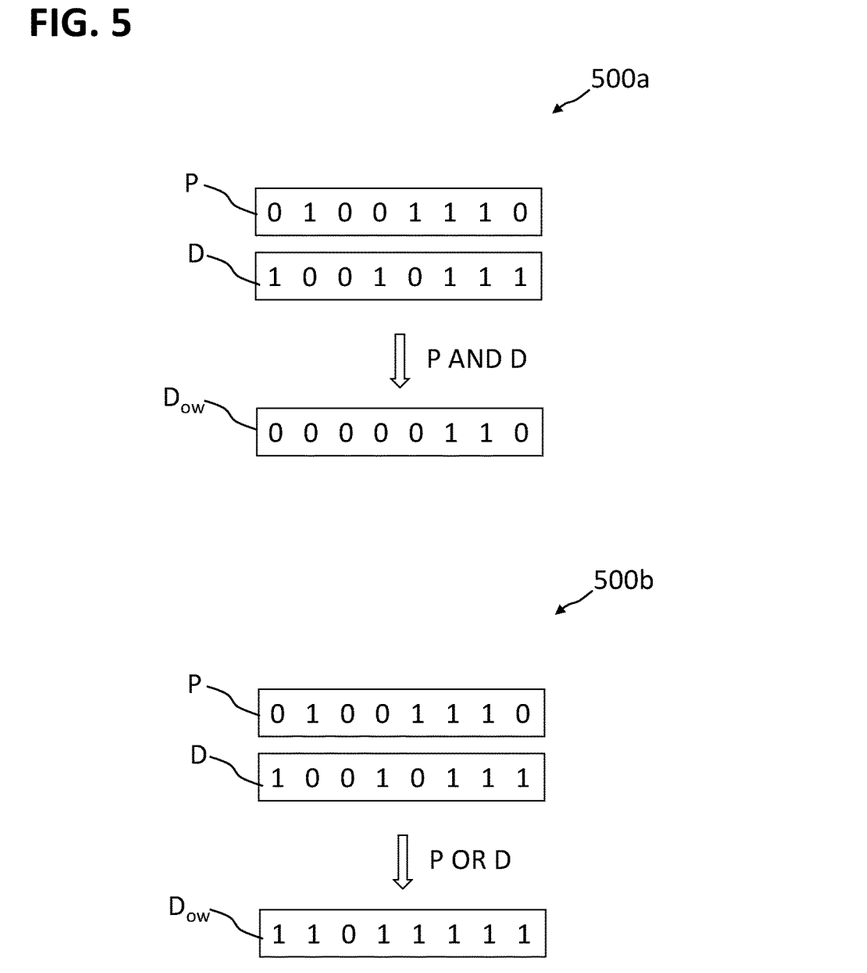
FIG. 5 shows an illustration of a method of operating a memory circuit in accordance with various embodiments.

FIG. 5 shows an illustration of a method of operating a memory circuit in accordance with various embodiments.

In various embodiments, the memory circuit may include a plurality of electrically programmable memory cells arranged in an electrically programmable non-volatile memory cell array along a plurality of rows and a plurality of columns, and a plurality of word lines, each word line coupled with at least one memory cell of the plurality of memory cells.

The memory circuit may in general be similar or identical to the memory circuit 100 of FIG. 1A and/or of FIG. 1B. The memory circuit in accordance with various embodiments may be configured to allow for an overlaid writing as described below instead of or in addition to being configured to allow for an overlaid reading as described above.

In various embodiments, the method of operating a memory circuit may allow to securely overwrite data, because afterwards, it may still be checked that the correct data were overwritten (and not some other data or no data at all).

In various embodiments, the method may include overwriting an already existing data word D, which may also be referred to as a base word D, which may include a sequence of known bits in a portion of a word line of the plurality of word lines, with at least one predefined pattern P, which may also be referred to as a data word P, which may include a sequence of data bits, to the portion of a word line, in other words, to the same portion of the word line as the existing data word D. The writing process may be referred to as overlaid writing. The overlaid writing of the already existing data word D with at least one predefined pattern P may yield the overlaid-writing data word $D_{ow}$. The writing may include combining the sequence of data bits with the sequence of known bits by a logic bitwise operation, e.g. a logic bitwise AND operation or a logic bitwise OR operation. The overlaid-writing data word $D_{ow}$, may also be referred to as a modified data word $D_{ow}$.

The overlaid-writing data word $D_{ow}$ yielded by the write operation may in various embodiments be defined by a logic operation, e.g. a logic AND, OR, NAND, NOR, XOR or XNOR, which may be performed, e.g. bitwise, on data bits of the data word D already existing on the word line 114 and the data bits of the predifined pattern P.

In various embodiments, the logic operation may be performed implicitly through an additional writing of the memory cells 102, and not by a dedicated logic gate.

In various embodiments, a write process may only be able to switch one or more of the memory cells 102 in one direction, but not in the other.

In an exemplary embodiment of an HS3P memory (e.g. as shown in FIG. 1A, with erased='1' and written='0'), the existing data word D may be overwritten with the pattern P, e.g. as shown in panel 500a of FIG. 5. Reading may now yield $D_{ow}$=D AND P, wherein AND may denote the bitwise logic AND operation.

In various embodiments, by checking $D_{ow}$ against D and P (using a read process subsequent to the overlaid writing process, performing one of a logic bitwise AND operation or a logic bitwise OR operation, which may correspond to the logic operation implicitly performed during the overlaid write process, on the data word P and the base word D, thereby forming a test word, and comparing the modified data word $D_{ow}$ to the test word), the overlaid writing may be used to verify that really the intended data were overwritten. In a case of the correct data being overwritten, it should hold $D_{ow}$=D AND P. If this condition is not fulfilled, a different (or no) word may have been overwritten and the original data (the base word) D may still be available.

In FIG. 5, in panel 500a, an exemplary overwriting, which may represent an implicit logic AND operation of the data word D already stored in the memory array and the predefined pattern P, is shown.

The implicit logic operation that may be performed by the overwriting may depend on a configuration of the memory circuit. In various embodiments, the logic operation may for example be an OR operation, which is shown in panel 500b of FIG. 5.

In various embodiments, the pattern P may be predefined and may preferably, for security reasons, include an equal number of '1's and '0's, such that the logic AND may affect half of the bits in the data word D during the overlaid writing. A protection of data by the overlay writing may rely on a high probability that the overlaid-write word $D_{ow}$=D AND P, which may be read for the verification that the overlaid write operation targeted the correct data word D, is different from D and P, because otherwise the check may be passed even though the wrong data were overwritten.

As a result, it may be desirable to have an, at least essentially, equal number of '1's and '0's in the predefined pattern P, but similarly also in the data word D. For the predefined pattern P, this may be easily achieved, since it may be made a property of the chosen pattern.

In various embodiments, for the data word D, in a case of encrypted data being used, this property may be automatically achieved with a high probability. For plain data, a suitable coding may be used, if the stored data is not "random" already.

As an illustrative example, the following may be considered:

If P=all-0→$D_{ow}$=P, and if P=all-1→$D_{ow}$=D. In the first case, $D_{ow}$ may not depend on D anymore, so it may be impossible to verify that it was D that was overwritten. In the second case, D may not have been overwritten at all, and D may thus still exist. A similar situation may apply for D=all-1 and for D=all-0, respectively.

In various embodiments, it may be advisable to iterate the described process several times with different values for P to gradually and verifiably reduce the amount of information left of D.

Partially building on the principle of overlaid writing, a constrained coding of random values may in various embodiments be performed. The random values may e.g. be used as keys for cryptographic computations.

In various embodiments, the constrained random value coding may make use of a special restriction of random values to contain a defined number of '0'.

Starting with an erased word (i.e. all-1) of width n, which may correspond to a word line portion of a word line 114 of the memory array, a random value P1 (for an understanding of an underlying overlaid write process, P1 may be considered as corresponding to the base word D), which may include exactly r1 written bits, may be written to the word line portion (and respectively the word) of width n. n−r1 bits in the word line portion may stay erased. This may result in R1=P1 being stored in the word line portion (and respectively, in the word). Thereby, a number of possible values of R1 may be limited to (n over r1) out of overall $2^n$ possible values.

In various embodiments, it may be advantageous that this property may be checked when the random value R1 is read out again. This may make it difficult or impossible for an attacker to substitute R1 by forcing a read to a different word. Without the constrained coding, any other value would have to be accepted, since any value would be a possible random value.

In various embodiments, performing an overlayed writing on this word (containing the exactly r1 written bits) with a value P2 containing additional r2 written bits (i.e. with r2 written bits that may be in bit positions that are not already taken by the r1 existing bits) may result in a new word containing a random value R2=R1 AND P2 with exactly r1+r2 written bits. n−r1−r2 bits may stay erased.

In various embodiments, this may again limit the number of possible random values to (n over (r1+r2)) out of overall $2^n$ possible values. However, it may still be advantageous that this property may be checked when the random value R2 is read out again.

In various embodiments, in a case where r1+r2=n/2, the value (n over (r1+r2)) may be maximized, i.e. the number of possible random values may be maximized, i.e. a randomness of R2 may be maximized.

For example for n=64, (n over (n/2))/$2^n$=9.93%, which may mean that 9.93% of all possible 64-bit random values may be validly coded, but this may also mean that an attacker may pass the check in 9.93% of all cases with a substituted unconstrained random value.

By appropriately defining r1 and r1+r2, a trade-off between the randomness of the values R1 and R2 and a success rate of an attacker using a substituted unconstrained random value may be found, and R1 and R2 may have different properties regarding randomness and protection level.

In various embodiments, the process of overlaid writing may be repeated iteratively with additional Ps, e.g. P3, P4, etc.

The overlaid writing of NVM data, e.g. as described above, may, in various embodiments, allow to securely overwrite also the value R (e.g., R1, R2, etc.): The data word R may be overwritten with a predefined pattern P, e.g. as described above. In various embodiments, afterwards, it may be verified that the correct data was overwritten.

In various embodiments, the word R may be overwritten, and thus its content invalidated, by writing R to a value that is invalid, e.g. to all-'0', so that the above described check of the constraint coding may surely fail.

Figure 6:
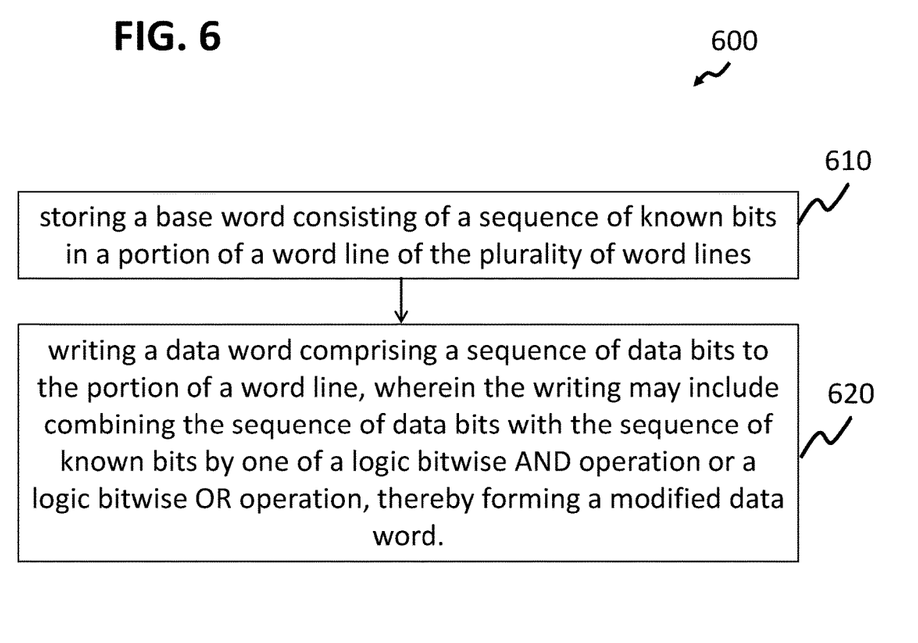
FIG. 6 shows a flow diagram of a method of operating a memory circuit in accordance with various embodiments.

FIG. 6 shows a flow diagram 600 of a method of operating a memory circuit in accordance with various embodiments.

In various embodiments, the memory circuit may include a plurality of electrically programmable memory cells arranged in an electrically programmable non-volatile memory cell array along a plurality of rows and a plurality of columns, a plurality of word lines, each word line coupled with a plurality of word portions of the plurality of memory cells, wherein each word portion is configured to store a data word, and at least one overlay word line coupled with a plurality of overlay portions, each overlay portion comprising a plurality of overlay memory cells, wherein each of the plurality of overlay portions comprises an overlay word, wherein the memory circuit is configured to read, for each of the plurality of word lines, from each of the word portions simultaneously with an overlay portion of the plurality of overlay portions, thereby providing, as an output of the read operation, a result of a logic operation performed on the data word and the overlay word.

In various embodiments, the method may include storing a base word consisting of a sequence of known bits in a portion of a word line of the plurality of word lines (in 610), and writing a data word comprising a sequence of data bits to the portion of a word line, wherein the writing may include combining the sequence of data bits with the sequence of known bits by one of a logic bitwise AND operation or a logic bitwise OR operation, thereby forming a modified data word (in 620).

In various embodiments, the overlaid reading, the overlaid writing, and the constrained random value coding, e.g. as described above, may be applied in any types of NVM, e.g. in RRAM, CBRAM, PCRAM, MRAM, flash memory (like UCP, HS3P, nano crystals, MONOS, ETOX, SST, SONOS, DiNOR), EEPROM, and the like.

In various embodiments, the overlaid reading, the overlaid writing, and the constrained random value coding, e.g. as described above, may be applied in other types of memories, e.g. in RAM (SRAM, DRAM) memory devices.

In various embodiments, the overlaid reading may be applied in ROM memory devices.

In various embodiments, the overlaid reading, the overlaid writing, and the constrained random value coding, e.g. as described above, may be applied in SSD, embedded NVM, stand-alone (memory stick), and other memory devices.

In various embodiments, a memory circuit is provided. The memory circuit may include a plurality of electrically programmable memory cells arranged in an electrically programmable non-volatile memory cell array along a plurality of rows and a plurality of columns, a plurality of word lines, each word line coupled with a plurality of word portions of the plurality of memory cells, wherein each word portion is configured to store a data word, and at least one overlay word line coupled with a plurality of overlay portions, each overlay portion comprising a plurality of overlay memory cells, wherein each of the plurality of overlay portions comprises an overlay word, wherein the memory circuit is configured to read, for each of the plurality of word lines, from each of the word portions simultaneously with an overlay portion of the plurality of overlay portions, thereby providing, as an output of the read operation, a result of a logic operation performed on the data word and the overlay word.

In various embodiments, the at least one overlay word line may be associated with at least one associated word line of the plurality of word lines, wherein each overlay portion is associated with one word portion of the at least one associated word line, and the plurality of overlay words forming a code configured to identify the associated word portion.

In various embodiments, the memory circuit may further include a switch configured to switch between the overlaid read of the word line and a read of the word line without the overlay by the at least one overlay word line.

In various embodiments, the logic operation performed on the data word and the overlay word may be one of a bitwise OR operation and a bitwise AND operation.

In various embodiments, the at least one associated word line may include a plurality of associated word lines.

In various embodiments, the at least one overlay word line may include one overlay word line.

In various embodiments, the at least one overlay word line may include a plurality of overlay word lines.

In various embodiments, each of the plurality of overlay word lines may include a different code.

In various embodiments, a method of operating the memory circuit in accordance with various embodiments is provided. The method may include reading at least one of the data words simultaneously with the associated overlay word, thereby providing, as an output of the read operation, a result of a logic operation performed on the data word and the overlay word.

In various embodiments, the method may further include reading the at least one of the data words without overlay by the overlay word.

In various embodiments, the method may further include performing the logic operation on the data word read without the overlay and the overlay word, thereby forming a test word.

In various embodiments, the method may further include comparing the test word with the result of the overlaid read.

In various embodiments, a method of operating a memory circuit is provided, the memory circuit including a plurality of electrically programmable memory cells arranged in an electrically programmable non-volatile memory cell array along a plurality of rows and a plurality of columns, and a plurality of word lines, each word line coupled with at least one memory cell of the plurality of memory cells, the method including storing a base word consisting of a sequence of known bits in a portion of a word line of the plurality of word lines, writing a data word comprising a sequence of data bits to the portion of a word line, wherein the writing may include combining the sequence of data bits with the sequence of known bits by one of a logic bitwise AND operation or a logic bitwise OR operation, thereby forming a modified data word.

In various embodiments, the method may further include reading the modified data word, performing one of a logic bitwise AND operation or a logic bitwise OR operation on the data word and the base word, thereby forming a test word, and comparing the modified data word to the test word.

In various embodiments, the sequence of known bits of the base word may include n bits, wherein approximately n/2 bits may be in a first bit state, and the remaining bits of the sequence of known bits may be in a second bit state.

In various embodiments, the base word may include a random word having a pre-defined number of zeros.

In various embodiments, the method may further include inverting at least one bit of the modified data word, thereby invalidating the modified data word.

Various aspects of the disclosure are provided for devices, and various aspects of the disclosure are provided for methods. It will be understood that basic properties of the devices also hold for the methods and vice versa. Therefore, for sake of brevity, duplicate description of such properties may have been omitted.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A memory circuit, comprising:
a plurality of electrically programmable memory cells arranged in an electrically programmable non-volatile memory cell array along a plurality of rows and a plurality of columns;
a plurality of word lines, each word line coupled with a plurality of word portions of the plurality of memory cells, wherein each word portion is configured to store a data word; and
at least one overlay word line coupled with a plurality of overlay portions, each overlay portion comprising a plurality of overlay memory cells, wherein each of the plurality of overlay portions comprises an overlay word;
wherein the memory circuit is configured to perform an overlaid read, comprising the memory circuit being configured to read, for each of the plurality of word lines, from each of the word portions simultaneously with an overlay portion of the plurality of overlay portions and configured to provide an output of the overlaid read, wherein the output is a result of a logic operation performed on the data word and the overlay word.

2. The memory circuit of claim 1,
wherein the at least one overlay word line is associated with at least one associated word line of the plurality of word lines, wherein each overlay portion is associated with one word portion of the at least one associated word line, and wherein each of the plurality of overlay portions comprises an overlay word, the plurality of overlay words forming a code configured to identify the associated word portion.

3. The memory circuit of claim 1, further comprising:
a switch configured to switch between the memory circuit performing the overlaid read of the word line and performing a normal read of the word line, wherein the normal read is performed without the at least one overlay word line.

4. The memory circuit of claim 1,
wherein the logic operation performed on the data word and the overlay word is one of the following, a bitwise OR operation and a bitwise AND operation.

5. The memory circuit of claim 1,
wherein the at least one associated word line comprises a plurality of associated word lines.

6. The memory circuit of claim 1,
wherein the at least one overlay word line comprises one overlay word line.

7. The memory circuit of claim 1,
wherein the at least one overlay word line comprises a plurality of overlay word lines.

8. The memory circuit of claim 7,
wherein each of the plurality of overlay word lines comprises a different code.

9. A method of operating the memory circuit, the memory circuit comprising:
- a plurality of electrically programmable memory cells arranged in an electrically programmable non-volatile memory cell array along a plurality of rows and a plurality of columns;
- a plurality of word lines, each word line coupled with a plurality of word portions of the plurality of memory cells, wherein each word portion is configured to store a data word; and
- at least one overlay word line coupled with a plurality of overlay portions, each overlay portion comprising a plurality of overlay memory cells, wherein each of the plurality of overlay portions comprises an overlay word;
- wherein the at least one overlay word line is associated with at least one associated word line of the plurality of word lines, wherein each overlay portion is associated with one word portion of the at least one associated word line, and wherein each of the plurality of overlay portions comprises an overlay word, the plurality of overlay words forming a code configured to identify the associated word portion;

wherein the method comprises:
- performing an overlay reading, comprising reading at least one of the data words simultaneously with the associated overlay word,
- providing an output of the overlaid read, the output being a result of a logic operation performed on the at least one read data word and the associated overlay word.

10. The method of claim 9, further comprising:
reading the at least one of the data words without overlay by the overlay word.

11. The method of claim 10, further comprising:
forming a test word, comprising performing a logic operation on the data word read without the overlay and the overlay word.

12. The method of claim 11, further comprising:
comparing the test word with the overlaid read output.

* * * * *